US009171892B2

(12) United States Patent
Kwon et al.

(10) Patent No.: US 9,171,892 B2
(45) Date of Patent: Oct. 27, 2015

(54) METHOD OF MANUFACTURING AN ORGANIC LIGHT EMITTING DISPLAY DEVICE BY PATTERNING AND FORMATION OF PIXEL AND GATE ELECTRODES

(75) Inventors: Do-Hyun Kwon, Suwon-si (KR); Il-Jeong Lee, Suwon-si (KR); Choong-Youl Im, Suwon-si (KR); Dae-Hyun No, Suwon-si (KR); Jong-Mo Yeo, Suwon-si (KR); Cheol-Ho Yu, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1494 days.

(21) Appl. No.: 12/342,170

(22) Filed: Dec. 23, 2008

(65) Prior Publication Data

US 2009/0267074 A1 Oct. 29, 2009

(30) Foreign Application Priority Data

Apr. 24, 2008 (KR) .................. 10-2008-0038255

(51) Int. Cl.
*H01L 51/40* (2006.01)
*H01L 27/32* (2006.01)
*H01L 29/49* (2006.01)
*H01L 27/12* (2006.01)

(52) U.S. Cl.
CPC .......... *H01L 27/3248* (2013.01); *H01L 27/124* (2013.01); *H01L 27/1288* (2013.01); *H01L 29/4908* (2013.01); *H01L 2227/323* (2013.01)

(58) Field of Classification Search
USPC ............... 257/E21.159, E21.162; 438/82, 99
See application file for complete search history.

(56) References Cited

U.S. PATENT DOCUMENTS

| 6,939,750 | B2 * | 9/2005 | Hotta et al. ............... 438/149 |
| 7,056,834 | B2 * | 6/2006 | Mei et al. ............... 438/758 |
| 7,741,640 | B2 * | 6/2010 | Seo et al. ............... 257/59 |
| 2002/0018176 | A1 | 2/2002 | Kobayashi et al. |
| 2002/0025591 | A1 | 2/2002 | Ohnuma et al. |
| 2003/0151049 | A1 | 8/2003 | Hotta et al. |

(Continued)

FOREIGN PATENT DOCUMENTS

| CN | 1798458 | 7/2006 |
| JP | 10-031233 | 2/1998 |

(Continued)

OTHER PUBLICATIONS

Extended European Search Report dated Nov. 2, 2011 in corresponding European Patent Application No. 09251172.4.

*Primary Examiner* — Howard Weiss
(74) *Attorney, Agent, or Firm* — H.C. Park & Associates, PLC

(57) ABSTRACT

A organic light emitting display device includes a thin film transistor (TFT) having a gate electrode, a source electrode and a drain electrode which are insulated from the gate electrode, and a semiconductor layer which is insulated from the gate electrode and which contacts each of the source electrode and the drain electrode; and a pixel electrode electrically connected to one of the source electrode and the drain electrode. The gate electrode is made up of a first conductive layer and a second conductive layer on the first conductive layer, and the pixel electrode is formed of the same material as the first conductive layer of the gate electrode on a same layer as the first conductive layer of the gate electrode.

12 Claims, 11 Drawing Sheets

(56) References Cited

U.S. PATENT DOCUMENTS

| | | |
|---|---|---|
| 2004/0256620 A1 | 12/2004 | Yamazaki et al. |
| 2005/0170548 A1 | 8/2005 | Yoon et al. |
| 2005/0230684 A1 | 10/2005 | Seo et al. |
| 2006/0147650 A1 | 7/2006 | Park |
| 2007/0252145 A1 | 11/2007 | Toyota et al. |
| 2008/0119018 A1* | 5/2008 | Toyota et al. ............ 438/164 |
| 2008/0206911 A1* | 8/2008 | Park et al. ............... 438/30 |
| 2009/0130600 A1* | 5/2009 | Irving et al. ............ 430/312 |

FOREIGN PATENT DOCUMENTS

| | | |
|---|---|---|
| JP | 2001-339072 | 12/2001 |
| JP | 2002-107762 | 4/2002 |
| JP | 2002-134756 | 5/2002 |
| JP | 2002-151523 | 5/2002 |
| JP | 2002-366057 | 12/2002 |
| JP | 2003-203919 | 7/2003 |
| JP | 2003-207804 | 7/2003 |
| JP | 2005-031651 | 2/2005 |
| JP | 2005-521919 | 7/2005 |
| JP | 2007-298649 | 11/2007 |
| KR | 1020040037889 | 5/2004 |
| KR | 2005-52026 | 6/2005 |
| KR | 2005-82104 | 8/2005 |
| KR | 2006-106209 | 10/2006 |
| KR | 2008-97055 | 11/2008 |

* cited by examiner

METHOD OF MANUFACTURING AN ORGANIC LIGHT EMITTING DISPLAY DEVICE BY PATTERNING AND FORMATION OF PIXEL AND GATE ELECTRODES

CROSS-REFERENCE TO RELATED PATENT APPLICATION

This application claims the benefit of Korean Patent Application No. 2008-38255, filed on Apr. 24, 2008 in the Korean Intellectual Property Office, the disclosure of which is incorporated herein in its entirety by reference.

BACKGROUND OF THE INVENTION

1. Field of the Invention

Aspects of the present invention relate to an organic light emitting display device and a method of manufacturing the same, and more particularly, to an organic light emitting display device and a method of manufacturing the same which reduces the number of times that masks are used, reduces manufacturing costs, and simplifies manufacture thereof.

2. Description of the Related Art

In general, an organic light emitting display device is a flat display device that includes organic light emitting diodes (OLEDs) as display elements, wherein each OLED has a pixel electrode, a counter electrode facing the pixel electrode, and an intermediate layer including an emission layer disposed between the pixel electrode and the counter electrode. Such an organic light emitting display device includes thin film transistors (TFTs) that control the function of each OLED.

FIGS. 1A through 1L are cross-sectional views for illustrating a conventional method of manufacturing an organic light emitting display device. According to the conventional method, as illustrated in FIG. 1A, a semiconductor layer 21 is patterned and formed on a substrate 10, a gate insulating layer 11 is formed to cover the semiconductor layer 21, a conductive layer 23a to be formed as a gate electrode is formed on the gate insulating layer 11, and a photoresist layer 23b for the gate electrode is formed on a portion of the conductive layer 23a. To produce the structure as illustrated in FIG. 1A, a first mask process is performed to pattern the semiconductor layer 21, and a second mask process is performed to form the photoresist layer 23b for the gate electrode.

Next, as illustrated in FIG. 1B, the gate electrode 23 is formed by patterning the conductive layer 23a for the gate electrode by using the photoresist layer 23b. Then, as illustrated in FIG. 1C, after an intermediate insulating layer 13 is formed to cover the gate electrode 23, a third mask process is performed to form via holes 13a, exposing a part of the semiconductor layer 21.

After the via holes 13a are formed, a conductive layer 25a for source/drain electrodes is formed as illustrated in FIG. 1D so that the conductive layer 25a for the source/drain electrodes contacts the semiconductor layer 21 through the via holes 13a. Next, as illustrated in FIG. 1E, a fourth mask process is performed to form a photoresist layer 25b on a portion of the conductive layer 25a for the source/drain electrodes. Next, by patterning the conductive layer 25a for the source/drain electrodes using the photoresist layer 25b, source/drain electrodes 25 insulated from the gate electrode 23 and respectively contacting the semiconductor layer 21 are formed to complete a TFT 20, as illustrated in FIG. 1F.

Then, as illustrated in FIG. 1G, a planarization layer 15 is formed to cover the source/drain electrodes 25, and a fifth mask process is performed to form a photoresist layer 15a for a contact hole on an entire surface of the planarization layer 15, except for where the contact hole is to be formed. Next, by etching the planarization layer 15 using the photoresist layer 15a for the contact hole, one of the source/drain electrodes 25 is exposed by the contact hole 15c formed in the planarization layer 15, as illustrated in FIG. 1H.

Next, as illustrated in FIG. 1I, a conductive layer 31a for a pixel electrode is formed to cover the planarization layer 15 and contact one of the source/drain electrodes 25 via the contact hole 15c. Then, a sixth mask process is performed to form a photoresist layer 31b for the pixel electrode on the conductive layer 31a so as to correspond to an area where a pixel electrode is to be formed. By patterning the conductive layer 31a using the photoresist layer 31b, a pixel electrode 31 that contacts one of the source/drain electrodes 25 is formed, as illustrated in FIG. 1K. Then, an insulating layer for a pixel defining layer is formed to cover the pixel electrode 31, and the insulating layer is patterned via a seventh mask process to form a pixel defining layer 17 in which at least a part of the pixel electrode 31 is exposed. Then, as illustrated in FIG. 1L, an intermediate layer 32 including an emission layer is formed on the pixel electrode 31 via an eighth mask process, and a counter electrode 33 is formed to over an entire display area, thereby forming an active matrix (AM) organic light emitting display device having an OLED 30 as a pixel, the emission of which is controlled by the TFT 20.

However, according to the above described conventional method of manufacturing the organic light emitting display device, since a total of eight mask processes have to be performed to form the TFT 20 and the OLED 30, many masks are used and the process is very complicated. Thus, the manufacturing costs of the display device are high and the yield is low.

SUMMARY OF THE INVENTION

Aspects of the present invention provide an organic light emitting display device and a method of manufacturing the same which reduces the number of times that masks are used, reduces manufacturing costs, and simplifies manufacture thereof.

According to an embodiment of the present invention, there is provided an organic light emitting display device including: a thin film transistor (TFT) having a gate electrode, a source electrode and a drain electrode which are insulated from the gate electrode, and a semiconductor layer which is insulated from the gate electrode and which contacts each of the source electrode and the drain electrode; and a pixel electrode electrically connected to one of the source electrode and the drain electrode, wherein the gate electrode comprises a first conductive layer and a second conductive layer on the first conductive layer, and the pixel electrode is formed of a same material as the first conductive layer of the gate electrode on a same layer as the first conductive layer of the gate electrode.

According to an aspect of the present invention, the first conductive layer may be formed of a transparent conductive material.

According to an aspect of the present invention, the organic light emitting display device may further include a wiring electrically connected to the gate electrode, wherein the wiring may comprise a first layer of conductive material on the same layer as the first conductive layer of the gate electrode and a second layer of conductive material on a same layer as the second conductive layer of the gate electrode.

According to an aspect of the present invention, the wiring may be formed of the same material as the gate electrode.

According to another embodiment of the present invention, there is provided a method of manufacturing an organic light emitting display device, the method including forming a first conductive layer and a second conductive layer on the first conductive layer, the first conductive layer being formed on a substrate; forming a patterned photoresist layer on a first area of the second conductive layer corresponding to where a gate electrode is to be formed and on a second area of the second conductive layer corresponding to where a pixel electrode is to be formed, wherein the patterned photoresist layer has a greater thickness at the first area than at the second area; patterning the first conductive layer and the second conductive layer by removing portions of the first conductive layer and the second conductive layer not covered by the patterned photoresist layer and removing the patterned photoresist layer on the second area; and removing the second conductive layer of the second area to form the pixel electrode and removing the patterned photoresist layer remaining on the first area to form the gate electrode.

According to an aspect of the present invention, the first conductive layer may be formed of a transparent conductive material.

According to an aspect of the present invention, the method may further include forming the patterned photoresist layer on a third area corresponding to where a wiring electrically connected to the gate electrode is to be formed, concurrently with the forming of the patterned photoresist layer on the first area and the second area, and wherein the thickness of the photoresist layer on the third area is greater than the thickness of the patterned photoresist layer on the second area.

According to an aspect of the present invention, the thickness of the patterned photoresist layer on the third area may be equal to the thickness of the patterned photoresist layer on the first area.

According to an aspect of the present invention, the forming of the patterned photoresist layer on the first area and the second area may be carried out using a halftone mask.

According to another embodiment of the present invention, there is provided a method of manufacturing an organic light emitting display device, the method comprising forming a semiconductor layer on a substrate; forming a gate insulating layer on the substrate and on the semiconductor layer; forming a first conductive layer on the gate insulating layer and forming a second conductive layer on the first conductive layer; forming a patterned photoresist layer on a first area of the second conductive layer corresponding to where a gate electrode is to be formed and on a second area of the second conductive layer corresponding to where a pixel electrode is to be formed, wherein the first area has a greater thickness than a second area; patterning the first conductive layer and the second conductive layer by removing portions of the first conductive layer and the second conductive layer not covered by the photoresist layer, removing the photoresist layer on the second area and partially removing the patterned photoresist layer on the first area; removing the second conductive layer of the second area to form the pixel electrode and the photoresist layer remaining on the first area to form the gate electrode; and forming source and drain electrodes electrically contacting the semiconductor layer, and wherein one of the source electrode and the drain electrode electrically contacts the pixel electrode.

According to another embodiment of the present invention, there is provided a method of manufacturing an organic light emitting display device, the method comprising concurrently forming a gate electrode and a pixel electrode using a same mask process.

Additional aspects and/or advantages of the invention will be set forth in part in the description which follows and, in part, will be obvious from the description, or may be learned by practice of the invention

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1A:
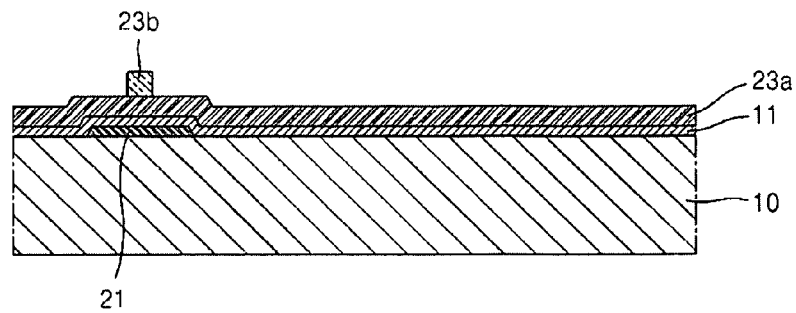
FIGS. 1A through 1L are cross-sectional views that illustrate a conventional method of manufacturing an organic light emitting display device.
Figure 1B:
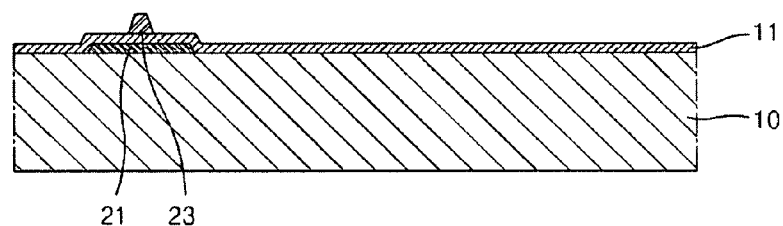
Figure 1C:
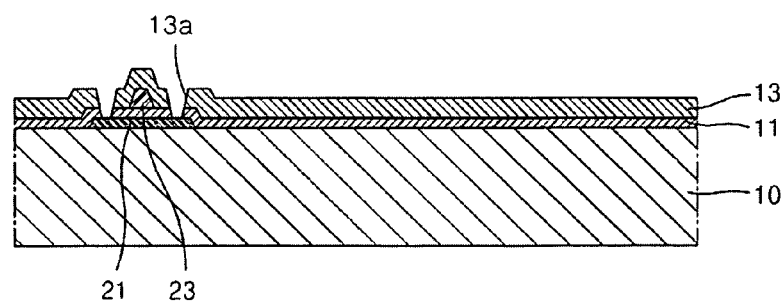
Figure 1D:
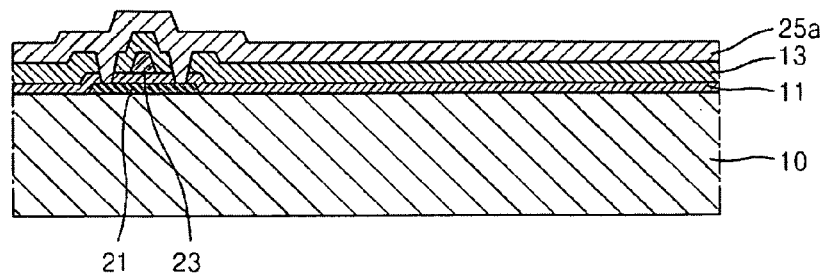
Figure 1E:
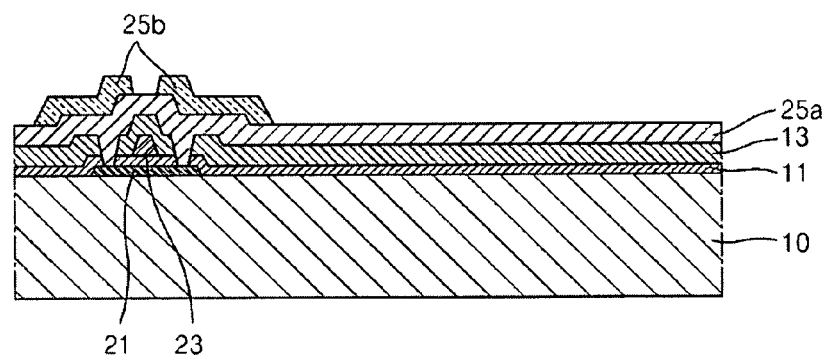
Figure 1F:
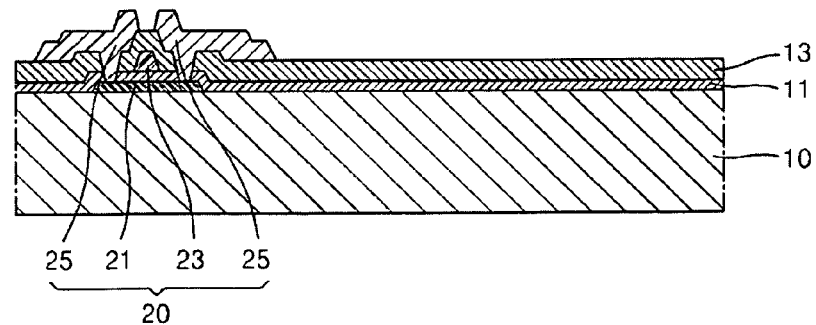
Figure 1G:
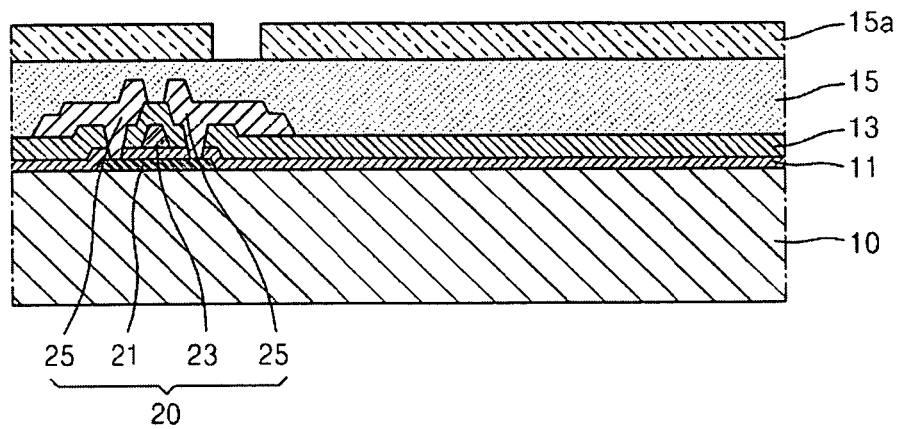
Figure 1H:
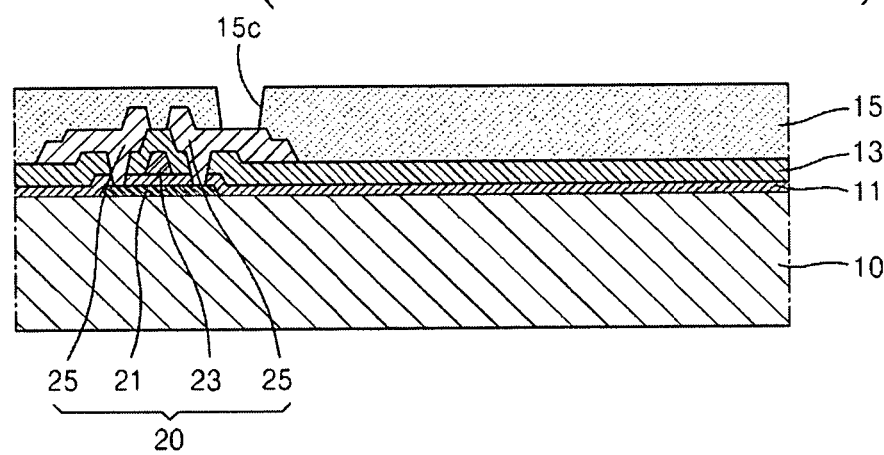
Figure 1I:
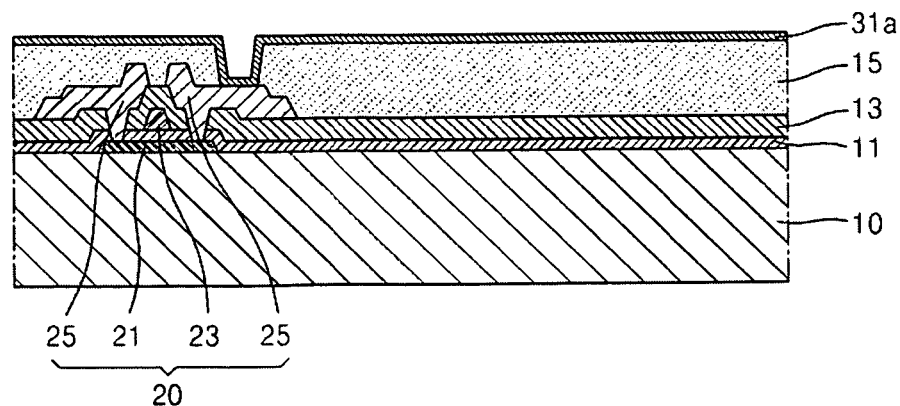
Figure 1J:
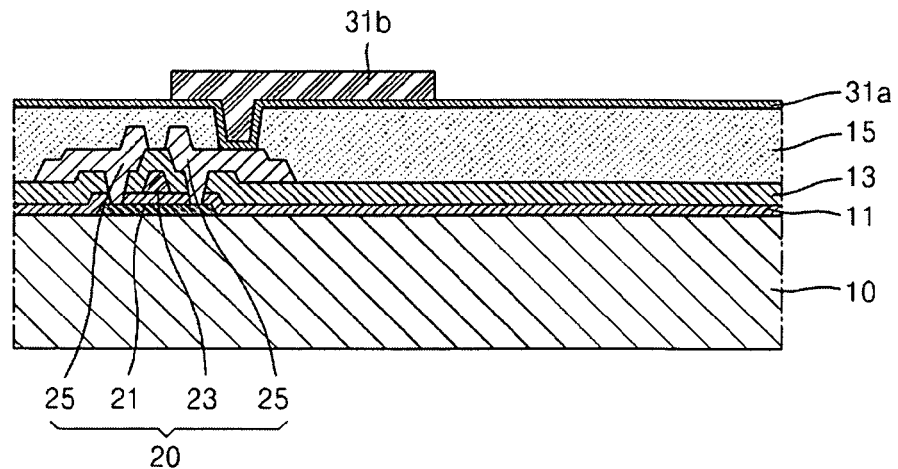
Figure 1K:
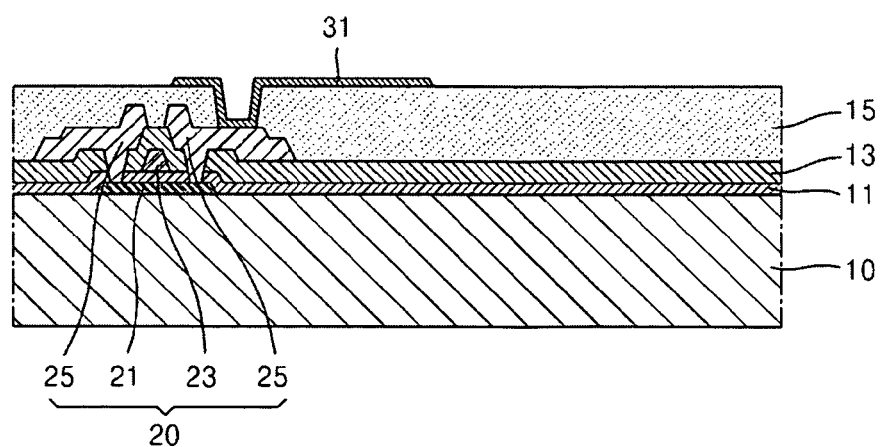

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Herein, it is to be understood that where is stated herein that one layer is "formed on" or "disposed on" a second layer, the first layer may be formed or disposed directly on the second layer or there may be intervening layers between the first layer and the second layer. Further, when used herein to describe a device, the term "formed on" is used with the same meaning as "located on" or "disposed on" and is not meant to be limiting regarding any particular fabrication process.

Figure 2A:
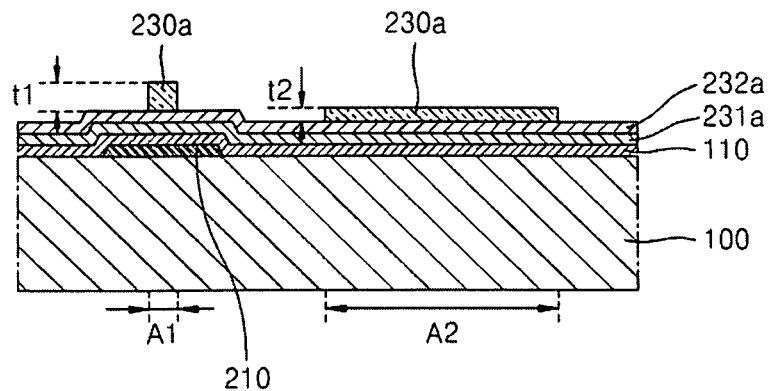
FIGS. 2A through 2J are cross-sectional views that illustrate a method of manufacturing an organic light emitting display device according to an embodiment of the present invention, with FIG. 2J illustrating the organic light emitting display device manufactured thereby.

FIGS. 2A through 2J are cross-sectional views that illustrate a method of manufacturing an organic light emitting display device according to an embodiment of the present invention. First, the multilayer body illustrated in FIG. 2A is formed. In particular, a patterned semiconductor layer 210 is formed on a substrate 100 via a first mask process. The substrate 100 can be formed of any suitable material such as, for example, a glass material, a plastic material such as an acryl, or a metal plate. If desired, a buffer layer (not shown) may be formed on the substrate 100 before the semiconductor layer 210 is formed.

After the semiconductor layer 210 is formed, a gate insulating layer 110 is formed to cover the substrate 100 and the semiconductor layer 210. The gate insulating layer may be formed of an insulating material such as silicone oxide or silicone nitride. Then, a first conductive layer 231a is formed on the gate insulating layer 110, and a second conductive layer 232a are formed on the first conductive layer 231a. The first conductive layer 231a may be formed of a transparent conductive material such as ITO, IZO, $In_2O_3$ or the like, and the second conductive layer 232a may be formed of a conductive material such as Mo, W, Al, Cu, Ag, or an alloy formed of the aforementioned various conductive materials. In particular, for reasons that will be discussed later, the first conductive layer 231a may be formed of a conductive material (such as indium tin oxide (ITO), indium zinc oxide (IZO), $In_2O_3$ or the like) that is relatively difficult to remove by etching, and the second conductive layer 232a may be formed of a conductive material (such as Mo, W, Al, Cu, Ag, or an alloy thereof) that is relatively easy to remove by etching. The first conductive layer 231a and the second conductive layer 232a may be formed sequentially. That is, the first conductive layer 231a may be formed on the gate insulating layer 110, and then the second conductive layer 232a may be formed of the first conductive layer 231a. Alternatively, the first conductive layer 231a and the second conductive layer 232a may be applied concurrently to the gate insulating layer 110, for example, by the use of a laser induced thermal induction (LITI) process.

After the first conductive layer 231a and the second conductive layer 232a are formed, a photoresist layer 230a is formed on areas of the second conductive layer 232a via a second mask process. In particular, the photoresist layer 230a is formed at a first area A1 corresponding to where a gate electrode 230 (see FIG. 2C) is to be formed and at a second area A2 corresponding to where a pixel electrode 210 (see FIG. 2C) is to be formed. The photoresist layer 230a is formed in such a manner that the thickness t1 of first area A1 is greater than the thickness t2 of second area A2. The formation of the photoresist layer 230a having different thicknesses may be accomplished using a single mask process using, for example, a halftone mask.

Figure 2B:
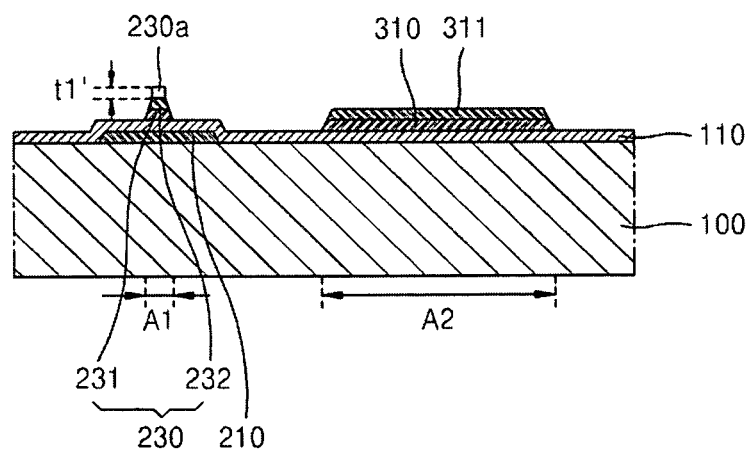

After the photoresist layer 230a is formed, the first conductive layer 231a and the second conductive layer 232a are patterned, that is, the parts of the first conductive layer 231a and the second conductive layer 232a that are not covered by the photoresist layer 230a are removed by dry etching. The photoresist layer 230a on the second area A2 is also removed. In particular, in the dry etching process, the photoresist layer 230a on the first area A1 and the photoresist layer 230a on the second area A2 are etched. Since the thickness t1 of the photoresist layer 230a on the first area A1 is greater than the thickness t2 of the photoresist layer 230a on the second area A2, the etching does not completely remove the photoresist layer 230a on the first area A1, although the photoresist layer 230a on the second area A2 is removed The photoresist layer 230a on the first area A1 maintains a thickness t1', as illustrated in FIG. 2B.

When the first conductive layer 231a and the second conductive layer 232a are patterned, at area A1, a gate electrode 230 is formed of a remaining portion of the first conductive layer 231 and a remaining portion of the second conductive layer 232. At area A2, a pixel electrode 310 and a second conductive material layer 311 are formed of same material as the first conductive layer 231 and the second conductive layer 232 of the gate electrode 230.

Figure 2C:
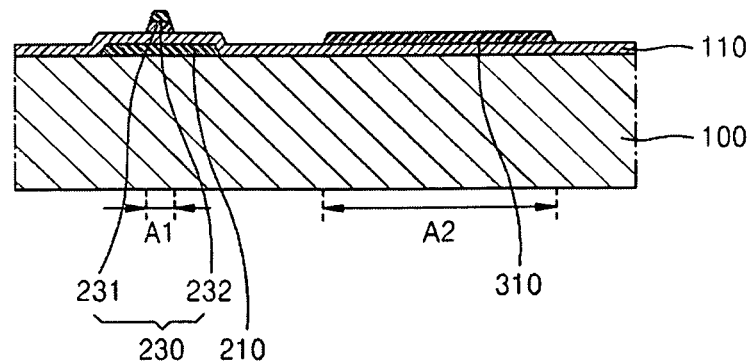

Then, by removing the second conductive material layer 311 from the second area A2 and the photoresist layer 230a from the first area A1, a multilayer body is obtained as illustrated in FIG. 2C, wherein, in the multilayer body, the gate electrode 230 including the first conductive layer 231 and the second conductive layer 232 on the first conductive layer 231 is disposed on the first area A1, and the pixel electrode 310, which is formed by using the same material as the first conductive layer 231 of the gate electrode 230 on a same layer as the first conductive layer 231 of the gate electrode 230, is disposed on the second area A2.

The second conductive material layer 311 on the second area A2 and the photoresist layer 230a remaining on the first area A1 may be removed by dry etching to obtain the structure shown in FIG. 2C. As described above with reference to FIG. 2A, when the first conductive layer 231a is formed of a transparent conductive material that is relatively difficult to remove by etching, such as ITO, IZO, $In_2O_3$ and the like, and the second conductive layer 232a is formed of a conductive material that is relatively easy to remove by etching, such as Mo, W, Al, Cu, Ag, or an alloy thereof, then, when dry etching is performed to the multilayer body illustrated in FIG. 2B, the second conductive material layer 311 in the second area A2 is easily etched but the pixel electrode 310 is not etched nor over-etched but remains, thereby obtaining the multilayer body illustrated in FIG. 2C.

As can be seen from the above description, both the gate electrode 230 and the pixel electrode 310 may be formed after performing only two mask processes. By contrast, in the conventional method of manufacturing the organic light emitting display device described with reference to FIGS. 1A through 1L, only two mask processes are required to form the gate electrode 23, but separate mask processes are further required to form the pixel electrode 31. Thus, the conventional method requires more mask processes than are used in the method of manufacturing the organic light emitting display device according to the current embodiment of the present invention. Hence, according to the method of manufacturing the organic light emitting display device according to the current embodiment of the present invention, a manufacturing process may be simplified, manufacturing costs may be reduced, and yield may be increased.

Figure 2D:
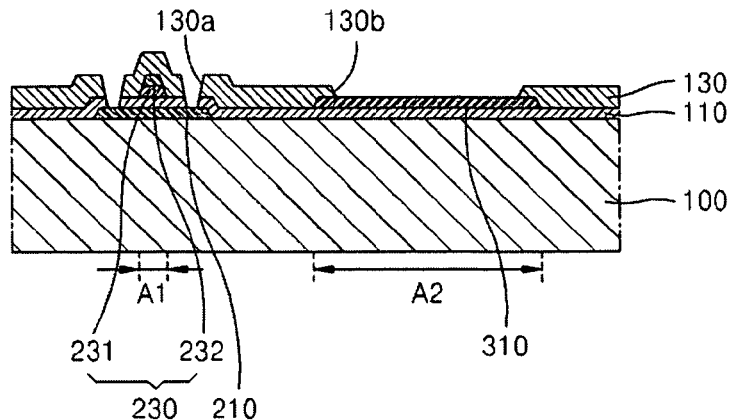

Next, after the gate electrode 230 and the pixel electrode 310 are formed as illustrated in FIG. 2C, an intermediate insulating layer 130 is formed to cover the gate electrode 230 and the pixel electrode 310. Then, as illustrated in FIG. 2D, via holes 130a exposing a part of the semiconductor layer 210, and an opening 130b exposing at least a part of the pixel electrode 310 are formed through a third mask process. The third mask process may also use a photoresist. Moreover, since the pixel electrode 310 is formed of a material that is difficult to etch, the pixel electrode 310 is not over-etched but is only exposed, regardless of whether dry etching or wet etching is used to form the opening 130b.

Figure 2E:
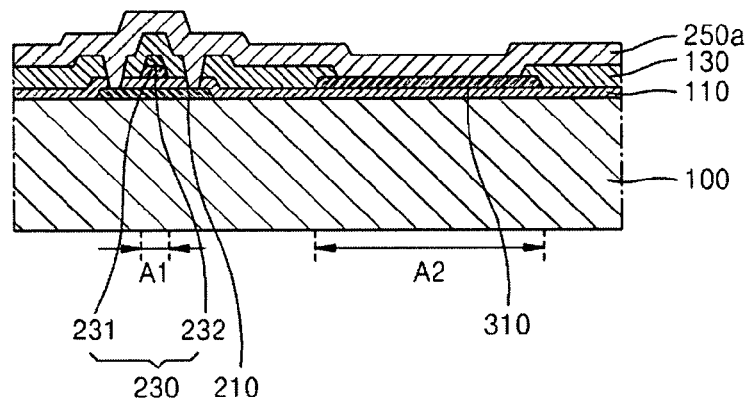

After the via holes 130a and the opening 130b are formed, a conductive layer 250a for source/drain electrodes is formed as illustrated in FIG. 2E so that the conductive layer 250a contacts the semiconductor layer 210 through the via holes 130a. Also, the conductive layer 250a contacts the pixel electrode 310 through the opening 130b. The conductive layer 250a may be formed of a conductive materials such as Ag, Mg, Al, Pt, Pd, Au, Ni, Nd, Ir, Cr, or a compound formed thereof.

Figure 2F:
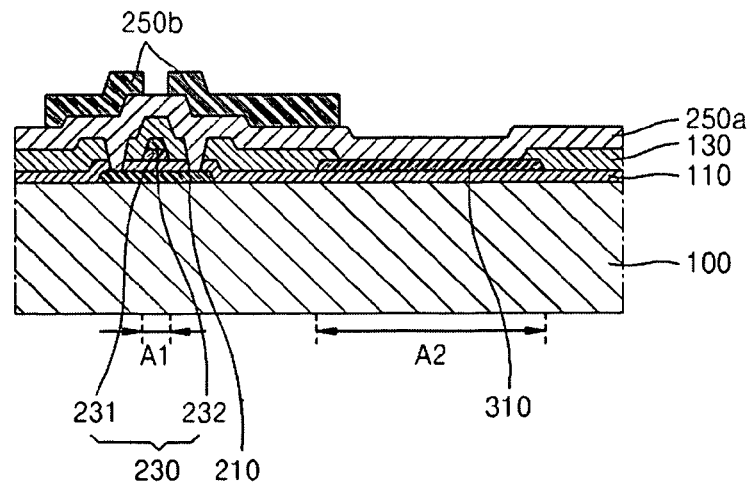

Next, a fourth mask process is performed to form a photoresist layer 250b for the source/drain electrodes on a portion of the conductive layer 250a where the source/drain electrodes are to be formed, as illustrated in FIG. 2F. Then, by patterning the conductive layer 250a by using the photoresist layer 250b, source/drain electrodes 250 insulated from the gate electrode 230 and respectively contacting the semiconductor layer 210 are formed to complete a thin film transistor (TFT) 200, as illustrated in FIG. 2G.

As described above, since the pixel electrode 310 is formed of a transparent conductive material that is relatively difficult to etch, such as ITO, IZO, $In_2O_3$ and the like, the pixel electrode 310 is not etched nor over-etched when the source/drain electrodes 250 are formed, but remains. Thereby, the multilayer body illustrated in FIG. 2G is obtained.

Figure 2G:
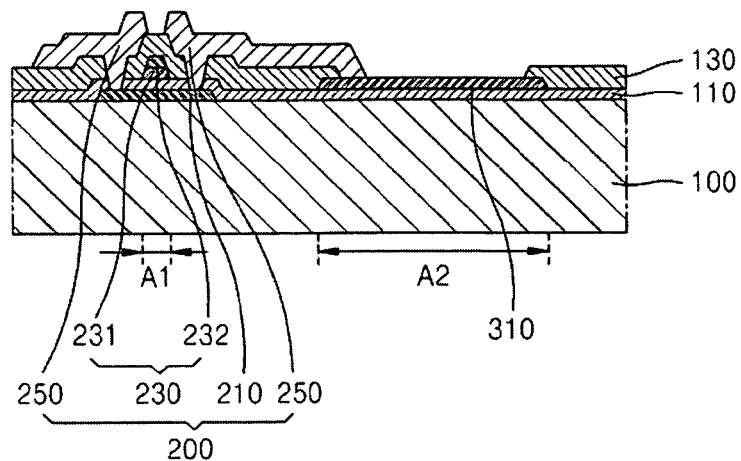

As illustrated in FIG. 2F, the photoresist layer 250b for the source/drain electrodes is structured such that after etching the conductive layer 250a to form the source/drain electrodes 250, one of the source/drain electrodes 250 contacts the pixel electrode 310, as illustrated in FIG. 2G.

Figure 2H:
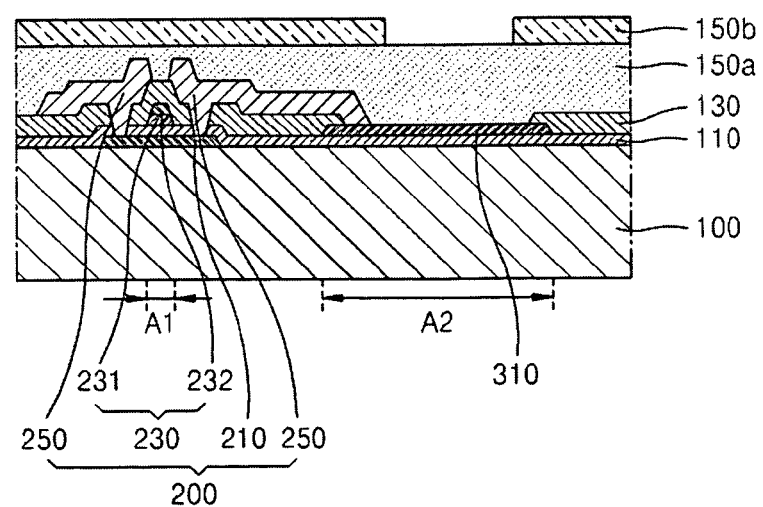
Figure 2I:
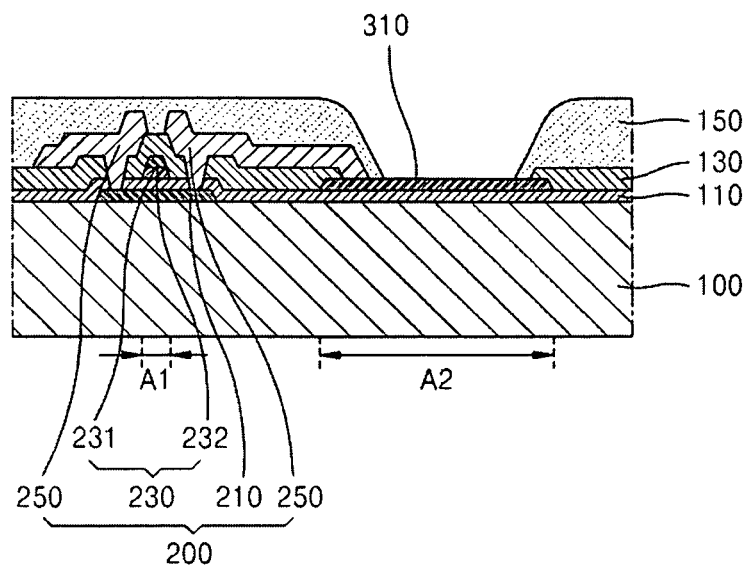
Figure 2J:
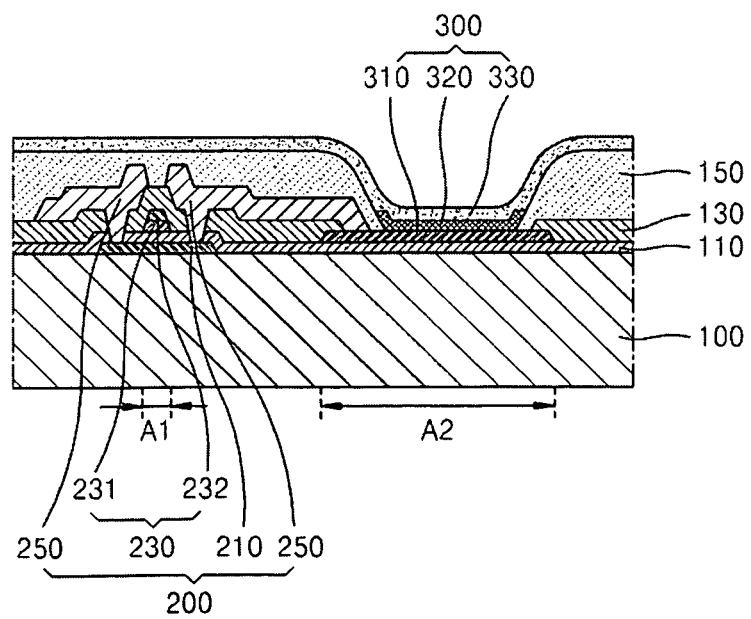

Then, as illustrated in FIG. 2H, an insulating layer 150a for a pixel defining layer is formed to cover the source/drain electrodes 250 and the pixel electrode 310, and a fifth mask process is performed so that a photoresist layer 150b for the pixel defining layer is formed on the insulating layer 150a, except for where an opening exposing at least a part of the pixel electrode 310 is to be formed. The insulating layer 150a may be formed of an insulating material such as silicone oxide or silicone nitride. Then, the insulating layer 150a is etched using the photoresist layer 150b so that a pixel defining layer 150 exposing at least a part of the pixel electrode 310 is formed as illustrated in FIG. 2I. Then, an intermediate layer 320 including an emission layer is formed on the pixel electrode 310 through a sixth mask process, and a counter electrode 330 is formed to cover the entire display area. As illustrated in FIG. 2J, an active matrix (AM) organic light emitting display device having an organic light emitting diode (OLED) 300 as a pixel, whose emission is controlled by the TFT 200 is thereby manufactured.

The intermediate layer 320 of the OLED 300 may be formed of a small molecular weight material or a polymer material. When a small molecular weight material is used, the intermediate layer 320 may be formed by stacking an emission layer (EML) and one or more of a hole injection layer (HIL), a hole transport layer (HTL), an electron transport layer (ETL), and an electron injection layer (EIL) in a single-layer or multilayer structure, and various organic materials such as copper phthalocyanine (CuPc), N,N'-di(naphthalene-1-yl)-N,N'-diphenyl-benzidine (NPB), tris-8-hydroxyquinoline aluminum (Alq3), and the like may be used. These layers may be formed by using a vacuum deposition method. When a polymer materials is used, in general, the intermediate layer 320 may include an HTL and an EML. For example, poly(3,4-ethylenedioxythiophene) (PEDOT) may be used as the HTL, and a poly-phenylenevinylene (PPV)-based polymer material or a polyfluorene-based polymer materials may be used as the EML. The HTL and the EML may be formed by using a screen printing method or an ink-jet printing method. However, the structure of the intermediate layer 320 is not limited thereto but may vary.

The counter electrode 330 may be formed as a transparent electrode or as a reflective electrode. When the counter electrode 330 is a transparent electrode, the counter electrode 330 may include a layer formed of a metal having a low work function such as Li, Ca, LiF/Ca, LiF/Al, Al, Ag, Mg or a compound thereof, and a transparent conductive layer such as ITO, IZO, ZnO or $In_2O_3$. When the counter electrode 330 is a reflective electrode, the counter electrode 330 may be a layer formed of Li, Ca, LiF/Ca, LiF/Al, Al, Ag, Mg or a compound thereof. A structure and materials forming the counter electrode 330 are not limited thereto but may vary.

According to the conventional method of manufacturing the organic light emitting display device described with reference to FIGS. 1A through 1L, a total of eight mask processes are required. However, by using the method of manufacturing the organic light emitting display device according to the current embodiment of the present invention, an AM organic light emitting display device can be manufactured using only six mask processes. Thus, according to the method of manufacturing the organic light emitting display device according to the current embodiment of the present invention, a manufacturing process may be simplified, manufacturing costs may be reduced, and yield may be increased.

FIG. 2J illustrates an organic light emitting display device that is manufactured according to the method described above. The organic light emitting display device includes a TFT 200 and a pixel electrode 310 which is electrically connected to one of source/drain electrodes 250 of the TFT 200. A gate electrode 230 includes a first conductive layer 231 and a second conductive layer 232 disposed on the first conductive layer 231. The pixel electrode 310 is formed of the same material as the first conductive layer 231 of the gate electrode 230 on a same layer as the first conductive layer 231 of the gate electrode 230. Such a first conductive layer 231 may be formed of a transparent conductive material such as ITO, IZO or $In_2O_3$. The organic light emitting display device according to the present embodiment has a simple structure and as described above, can be formed with fewer mask processes, thereby enabling an increase in the production yield and a reduction in manufacturing costs, compared to the conventional organic light emitting display device that is illustrated in FIG. 1L.

Figure 1L:
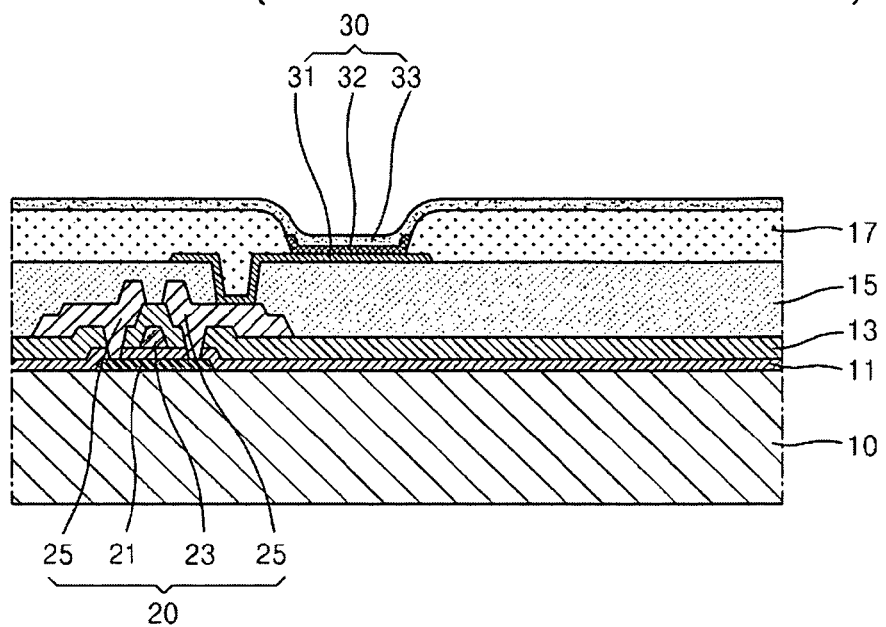

Furthermore, in the conventional organic light emitting display device of FIG. 1L, which was manufactured by using the conventional method, the pixel electrode 31 is disposed on a top surface of the TFT 20 such that the gate insulating layer 11, the intermediate insulating layer 13, and the planarization layer 15 are interposed between the substrate 10 and the pixel electrode 31. However, in the organic light emitting display device of FIG. 2J according to aspects of the present invention (manufactured by using the method of manufacturing the organic light emitting display device described above), the pixel electrode 310 is disposed on the same layer as the first conductive layer 231 of the gate electrode 230 such that only the gate insulating layer 110 is interposed between the pixel electrode 310 and the substrate 100. Thus, as can be seen in reference to FIG. 2J, in a bottom emission type organic light emitting display device, the number of layers through which a light emitted from the intermediate layer 320 passes before being emitted to the outside through the pixel electrode 310 and the substrate 100 is highly reduced, compared to the number of layers through which a light in the conventional organic light emitting display device passes before being emitted to the outside. Therefore, optical efficiency may be greatly enhanced.

Also, the number of layers included in the organic light emitting display device of FIG. 2J according to aspects of the present invention is reduced, compared to the number of layers included in the conventional organic light emitting display device of FIG. 1L. Thus, it may be possible to simplify a structure of the organic light emitting display device so as to increase a yield and to reduce manufacturing costs.

FIGS. 3A through 3D are cross-sectional views to illustrate a method of manufacturing an organic light emitting display device according to another embodiment of the present invention.

Figure 3A:
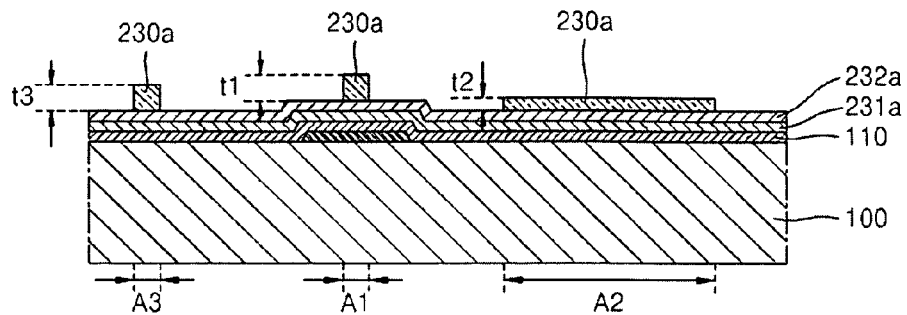
FIGS. 3A through 3D are cross-sectional views that illustrate a method of manufacturing an organic light emitting display device according to another embodiment of the present invention, with FIG. 3D illustrating the organic light emitting display device manufactured thereby.

First, a multilayer body as illustrated in FIG. 3A is formed. In particular, a semiconductor layer 210 patterned on a substrate 100 is formed through a first mask process. If desired, a buffer layer (not shown) may be formed on the substrate 100 before the semiconductor layer 210 is formed.

After the semiconductor layer 210 is formed, a gate insulating layer 110 is formed using an insulating material. Then, a first conductive layer 231a and a second conductive layer 232a on the first conductive layer 231a are formed on the gate insulating layer 110. The first conductive layer 231a may be formed of a transparent conductive material such as ITO, IZO, $In_2O_3$ or the like, and the second conductive layer 232a may be formed of a conductive material such as Mo, W, Al, Cu, Ag, or an alloy formed thereof.

After the first conductive layer 231a and the second conductive layer 232a are formed, a photoresist layer 230a is formed on a areas of the second conductive layer 232a through a second mask process. In particular, the photoresist layer 230a is formed at a first area A1 corresponding to where a gate electrode 230 (see FIG. 3C) is to be formed, at a second area A2 corresponding to where a pixel electrode 210 (see FIG. 3C) is to be formed, and at a third area A3, where a wiring electrically connected to the gate electrode 230 is to be formed. The photoresist layer 230a is formed in such a manner that a thickness t1 of a first area A1 where the gate electrode is to be formed is greater than a thickness t2 of a second area A2 where a pixel electrode is to be formed. A thickness t3 of the photoresist layer 230a on the third area A3 is also greater than the thickness t2 of the photoresist layer 230a on the second area A2. For example, the thickness t3 of the photoresist layer 230a on the third area A3 may be f equal to the thickness t1 of the photoresist layer 230a on the first area A1. The formation of the photoresist layer 230a having different thicknesses may be accomplished using a single mask process using, for example, a halftone mask.

Figure 3B:
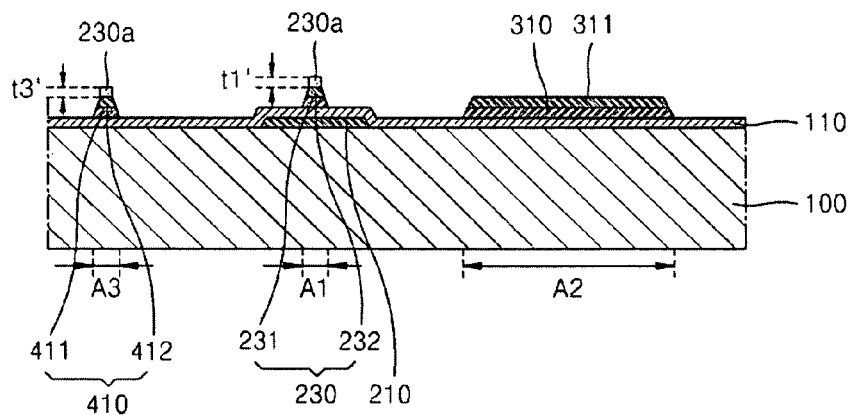

After the photoresist layer 230a is formed, the first conductive layer 231a and the second conductive layer 232a are patterned, that is the areas that are not covered by the photoresist layer 230a are removed by dry etching. The photoresist layer 230a on the second area A2 is also removed. In particular, in the dry etching process, the photoresist layer 230a on the first area A1, the photoresist layer 230a on the second area A2, and the photoresist layer 230a on the third area A3 are etched. Since the thickness t1 of the photoresist layer 230a on the first area A1 and the thickness t3 of the photoresist layer 230a on the third area A3 are greater than the thickness t2 of the photoresist layer 230a on the second area A2, the etching does not completely remove the photoresist layer 230a on the first area A1 or the photoresist layer 230a on the third area A3, although the photoresist layer 230a on the second area A2 is removed. The photoresist layer 230a on the first area A1 maintains a thickness t1' and the photoresist layer 230a on the second area A3 maintains a thickness t3', as illustrated in FIG. 3B.

When the first conductive layer 231a and the second conductive layer 232a are patterned, at area A1, a gate electrode 230 is formed of first conductive layer 231 and second conductive layer 232 (that is, of a remaining portion of the first conductive layer 231a and second conductive layer 232a). At area A2, a pixel electrode 310 and a second conductive material layer 311 are formed of the same material as the first conductive layer 231 of the gate electrode 230 on a same layer as the first conductive layer 231 and the second conductive layer 232 of the gate electrode 230. At area A3, a wiring 410 is formed including a first conductive layer 411 and a second conductive layer 412 on the first conductive layer 411 (that is, of a remaining portion of the first conductive layer 231a and the second conductive layer 232a).

Figure 3C:
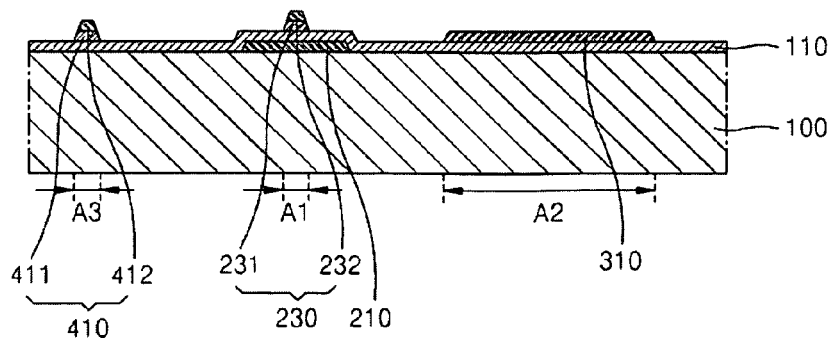

Then, by removing the second conductive material layer 311 on the second area A2, the photoresist layer 230a remaining on the first area A1, and the photoresist layer 230a remaining on the third area A3, a multilayer body may be obtained as illustrated in FIG. 3C, wherein in the multilayer body, the gate electrode 230 including the first conductive layer 231 and the second conductive layer 232 on the first conductive layer 231 is disposed on the first area A1, the pixel electrode 310 formed by using the same material as the first conductive layer 231 of the gate electrode 230 on the same layer as the first conductive layer 231 of the gate electrode 230 is disposed on the second area A2, and the wiring 410 including the first conductive layer 411 and the second conductive layer 412 on the first conductive layer 411 is formed on the third area A3. The second conductive material layer 311 on the second area A2, the photoresist layer 230a remaining on the first area A1, and the photoresist layer 230a remaining on the third area A3 may be removed by dry etching.

As can be seen from the above description, the gate electrode 230, the pixel electrode 310, and the wiring 410 may be formed after performing only two mask processes. By contrast, in the conventional method of manufacturing the organic light emitting display device described with reference to FIGS. 1A through 1L, only two mask processes are required so as to form the gate electrode 23 but separate mask processes are further required to form the pixel electrode 31. Thus, the conventional method requires more mask processes than are used in the method of manufacturing the organic light emitting display device according to the current embodiment of the present invention. Thus, according to the method of manufacturing the organic light emitting display device according to the current embodiment of the present invention, a manufacturing process may be simplified, manufacturing costs may be reduced, and yield may be increased.

Next, after the gate electrode 230, the pixel electrode 310, and the wiring 410 are formed as illustrated in FIG. 3C, a process similar to a process which has been described with reference to FIGS. 2D through 2J is performed, and then an AM organic light emitting display device having an OLED 300 as a pixel, whose emission is controlled by a TFT 200 is manufactured.

According to the conventional method of manufacturing the organic light emitting display device described with reference to FIGS. 1A through 1L, a total of eight mask processes are required. However, by using the method of manufacturing the organic light emitting display device according to the current embodiment of the present invention, are required to manufacture an AM organic light emitting display device can be manufactured using a total of six mask processes. Thus, according to the method of manufacturing the organic light emitting display device according to the current embodiment of the present invention, a manufacturing process may be simplified, manufacturing costs may be reduced, and yield may be increased.

Figure 3D:
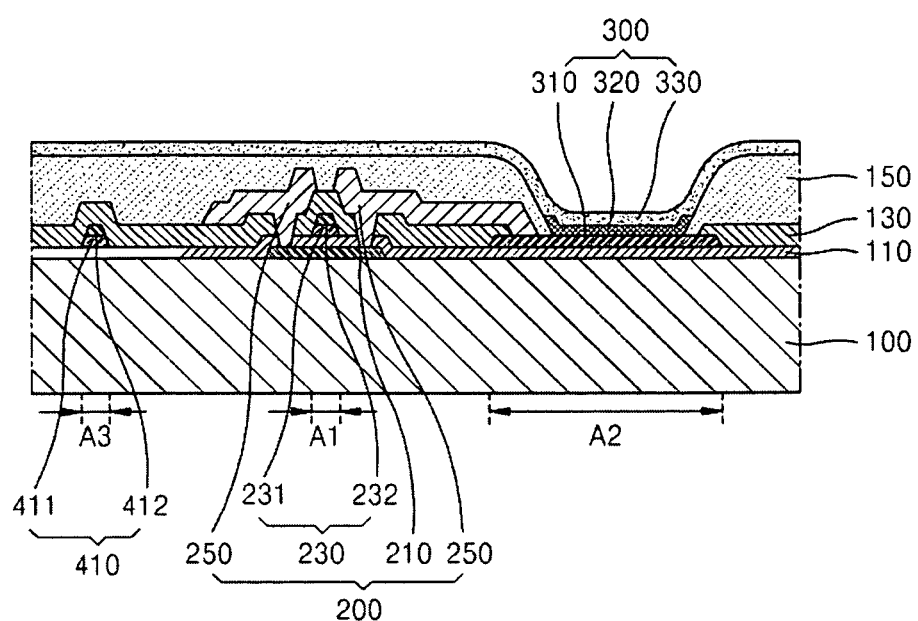

FIG. 3D illustrates an organic light emitting display device of FIG. 3D that is manufactured according to the method described above. The organic light emitting display device includes a TFT 200, a pixel electrode 310 electrically connected to one of source/drain electrodes 250 of the TFT 200, and a wiring 410. A gate electrode 230 includes a first conductive layer 231 and a second conductive layer 232 on the first conductive layer 231. The pixel electrode 310 is formed of the same material as the first conductive layer 231 of the gate electrode 230 on a same layer as the first conductive layer 231 of the gate electrode 230, and the wiring 410 has the same structure and is formed of the same layers as the gate electrode 230. Such a first conductive layer 231 may be formed of transparent conductive materials such as ITO, IZO and $In_2O_3$. The organic light emitting display device according to the present embodiment has a simple structure and can be formed with fewer mask processes, thereby enabling an increase in production yield and a reduction in manufacturing costs, compared to the conventional organic light emitting display device as illustrated in FIG. 1L.

Furthermore, in the conventional organic light emitting display device of FIG. 1L manufactured by using the conventional method, the pixel electrode 31 is disposed on a top surface of the TFT 20 such that the gate insulating layer 11, the intermediate insulating layer 13, and the planarization layer 15 are interposed between the substrate 10 and the pixel electrode 31. However, in the organic light emitting display device of FIG. 3D according to aspects of the present invention (manufactured by using the method of manufacturing the organic light emitting display device illustrated in FIGS. 3A through 3C), the pixel electrode 310 is disposed in a same layer as the first conductive layer 231 of the gate electrode 230 so that only the gate insulating layer 110 is interposed between the pixel electrode 310 and the substrate 100. Thus, in a bottom emission type organic light emitting display device, the number of layers through which a light emitted from the intermediate layer 320 in a rear emission organic light emitting display device passes before being emitted to the outside via the pixel electrode 310 and the substrate 100 is greatly reduced, compared to the number of layers through which a light in the conventional organic light emitting display device passes before being emitted to the outside. Therefore, optical efficiency may be greatly enhanced.

Also, the number of layers included in the organic light emitting display device of FIG. 3D according to aspects of the present invention is reduced, compared to the number of layers included in the conventional organic light emitting display device of FIG. 1L, thus, it may be possible to simplify a structure of the organic light emitting display device so as to increase yield and reduce manufacturing costs.

The organic light emitting display device and the method of manufacturing the same can embody an organic light emitting display device which reduces the number of times that masks are used, reduces manufacturing costs, and simplifies manufacture thereof.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing an organic light emitting display device, the method comprising:
    forming a first conductive layer and a second conductive layer on the first conductive layer, the first conductive layer being formed on a substrate;
    forming a patterned photoresist layer on a first area of the second conductive layer corresponding to where a gate electrode is to be formed and on a second area of the second conductive layer corresponding to where a pixel electrode is to be formed, wherein the patterned photoresist layer has a greater thickness at the first area than at the second area;
    patterning the first conductive layer and the second conductive layer by removing portions of the first conductive layer and the second conductive layer not covered by the patterned photoresist layer, and removing the patterned photoresist layer on the second area; and
    removing the second conductive layer of the second area to form the pixel electrode and removing the patterned photoresist layer remaining on the first area to form the gate electrode,
    wherein removing the second conductive layer of the second area to form the pixel electrode and removing the patterned photoresist layer remaining on the first area to form the gate electrode is performed using the same etching process.

2. The method of claim 1, wherein the first conductive layer is formed of a transparent conductive material.

3. The method of claim 1, wherein the first conductive layer is formed of a material that is more difficult to etch than a material that forms the second conductive layer.

4. The method of claim 1, wherein the first conductive layer is formed of indium tin oxide, indium zinc oxide or $In_2O_3$ and the second conductive layer is formed of Mo, W, Al, Cu, Ag, or an alloy thereof.

5. The method of claim 1, wherein the first conductive layer and the second conductive layer are formed sequentially.

6. The method of claim 1, wherein the first conductive layer and the second conductive layer are formed concurrently.

7. The method of claim 1, wherein the patterned resist layer on the first area is partially removed in a thickness direction concurrent with the removing of the patterned resist layer on the second area.

8. The method of claim 1, wherein the forming of the patterned photoresist layer on the first area and the second area is carried out using a halftone mask.

9. The method of claim 1, further including forming the patterned photoresist layer on a third area of the second conductive layer corresponding to where a wiring electrically connected to the gate electrode is to be formed, concurrently with the forming of the patterned photoresist layer on the first area and the second area, and wherein the thickness of the patterned photoresist layer on the third area is greater than the thickness of the patterned photoresist layer on the second area and further including removing the patterned photoresist layer from the third area concurrently with the removing of the patterned photoresist layer from the first area and the removing of the second conductive layer from the second area.

10. The method of claim 9, wherein the thickness of the patterned photoresist layer on the third area is equal to the thickness of the patterned photoresist layer on the first area.

11. The method of claim 9, wherein the forming of the patterned photoresist layer on the first area, the second area and the third area is carried out using a halftone mask.

12. The method of claim 1, wherein removing the patterned photoresist layer on the second area comprises removing the photoresist layer on the second area and the first layer such that a portion of the patterned photoresist layer remains on the first area.

* * * * *